(12) United States Patent
Chang et al.

(10) Patent No.: US 7,932,186 B2
(45) Date of Patent: Apr. 26, 2011

(54) METHODS FOR FABRICATING AN ELECTRONIC DEVICE

(75) Inventors: Kuo-Jui Chang, Hsinchu County (TW); Meei-Yu Hsu, Kaohsiung (TW); Feng-Yu Yang, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 548 days.

(21) Appl. No.: 12/061,866

(22) Filed: Apr. 3, 2008

(65) Prior Publication Data

US 2009/0155964 A1 Jun. 18, 2009

(30) Foreign Application Priority Data

Dec. 14, 2007 (TW) ................................ 96147927 A

(51) Int. Cl.
*H01L 21/336* (2006.01)
*H01L 21/8234* (2006.01)
*H01L 21/469* (2006.01)
*H01L 21/31* (2006.01)

(52) U.S. Cl. ............................ 438/758; 438/197; 257/40
(58) Field of Classification Search ....................... None
See application file for complete search history.

(56) References Cited

U.S. PATENT DOCUMENTS

2007/0105396 A1* 5/2007 Li et al. ................... 438/758
2009/0298296 A1* 12/2009 Burdinski ................ 438/758
2010/0032657 A1* 2/2010 Yanai et al. ............... 257/40

* cited by examiner

*Primary Examiner* — Andy Huynh
*Assistant Examiner* — Valerie Brown

(57) ABSTRACT

A method for fabricating an electronic device is provided. The method for fabricating the electrical device comprises providing a substrate. A patterned first self-assembled monolayer (SAM) and an adjacent patterned second SAM are formed on the substrate, wherein the patterned first SAM has a higher affinity then that of the patterned second SAM. A conductive, semiconductor or insulating material is dissolved or suspended in a solvent to form a solution. The solution is coated on the substrate. The solvent in the solution is removed to selectively form a patterned conductive, semiconductor or insulating layer on the patterned first SAM.

18 Claims, 8 Drawing Sheets

METHODS FOR FABRICATING AN ELECTRONIC DEVICE

BACKGROUND OF THE INVENTION

1. Field of the Invention

The present invention relates to a method for fabricating an electronic device, and in particular to a method for patterning a layer of an electronic device.

2. Description of the Related Art

Organic thin film transistors (OTFTs) have drawn considerable interest in the past due to their low weight, lower fabrication cost relative to large area, simple fabrication method, thin profile, and mechanical flexibility. In recent years, new organic electronic device materials and fabricating technologies have been developed. In terms of materials, organic materials comprising organic semiconductor materials, organic dielectric materials and organic conductive polymer materials using solution processes are touted to become mainstream moving forward.

Patterning an organic material layer is a necessary method for fabricating an electronic device. For example, in the case of an OTFT, if a semiconductor layer is not isolated or patterned, device leakage current is high, and device On/Off current (Ion/Ioff) can't be improved. Additionally, an electronic device can't be fabricated if the design is too difficult. The conventional patterning processes for an organic material layer may comprise ink-jet printing, lithographic etching, photochemical crosslinking, micro-contact printing or shadow masking. However, most organic materials are unstable compounds which are sensitive to oxygen or water. As such, the described organic materials may be destroyed by etching. Also, the shadow masking process is a costly vacuum process and the ink-jet printing process has a length of time shortcoming.

Therefore, a method for patterning a layer of an electronic device more quickly and precisely is needed.

BRIEF SUMMARY OF INVENTION

To solve the above-described problems, a method for fabricating an electronic device is provided. An exemplary embodiment of a method for fabricating an electrical device comprises providing a substrate. A patterned first self-assembled monolayer (SAM) and an adjacent patterned second SAM are formed on the substrate, wherein the patterned first SAM has a higher affinity then that of the patterned second SAM. Next, a conductive, semiconductor or insulating material is dissolved or suspended in a solvent to form a solution. The solution is then coated on the substrate. The solvent in the solution is removed to selectively form a patterned conductive, semiconductor or insulating layer on the patterned first SAM.

Another exemplary embodiment for a method for an electronic device comprises providing a substrate having a channel region and a pair of source/drain regions, wherein a pair of the source/drain regions are adjacent to two sides of the channel region, respectively. A dielectric layer is then formed on the substrate. Next, a pair of source/drain layers is formed on the dielectric layer in the source/drain regions. A patterned first self-assembled monolayer is then formed on the dielectric layer in the channel region and a portion of the source/drain layers adjacent to two sides of the channel region, and a patterned second self-assembled monolayer is formed on the remaining source/drain layers, wherein the patterned first self-assembled monolayer has a higher affinity then that of the patterned second self-assembled monolayer. Next, a semiconductor layer is selectively formed on the patterned first self-assembled monolayer.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

Figure 1A:
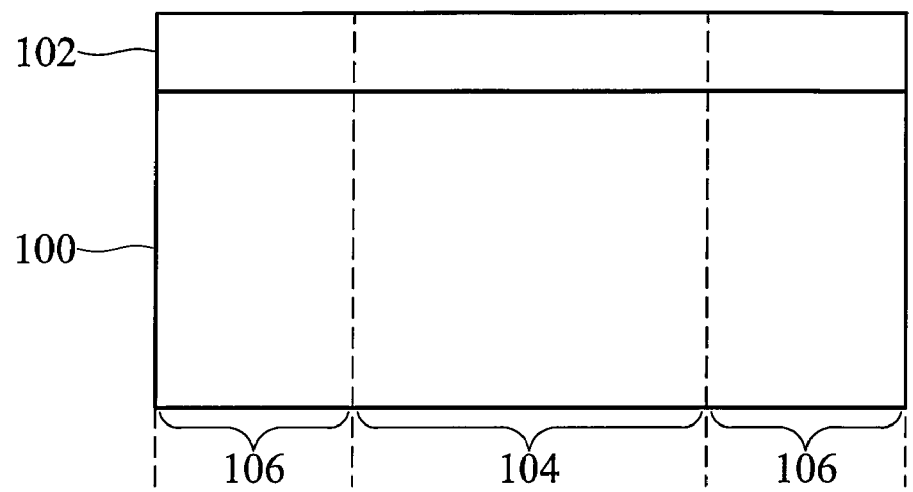
FIGS. 1a to 1g show cross sections of an embodiment of an electronic device of the invention.

Table 1 shows combinations of a patterned first/third self-assembled monolayer and a second/fourth self-assembled monolayer.

Table 2 shows electrical performance comparisons of an embodiment for a fabricated organic thin film transistor of the invention and a conventional organic thin film transistor.

DETAILED DESCRIPTION OF INVENTION

The following description is of a mode of carrying out the invention. This description is made for the purpose of illustrating the general principles of the invention and should not be taken in a limiting sense. The scope of the invention is determined by reference to the appended claims.

FIGS. 1a to 1g show cross sections of an embodiment of an electronic device of the invention. Wherever possible, the same reference numbers are used in the drawings and the descriptions to refer the same or like parts.

FIG. 1a shows the initial step of an embodiment of forming an electronic device of the invention. In one embodiment, the electronic device may comprise an organic thin film transistor (OTFT). A substrate 100 is provided. The substrate 100 may have a channel region 104 and a pair of source/drain regions 106, wherein a pair of the source/drain regions 106 is adjacent to two sides of the channel region 104, respectively. The substrate 100 may comprise inorganic materials or organic materials such as organic polymers. For inorganic materials, the substrate 100 may comprise, for example, doped silicon substrates with a resistivity of about 0.008~0.02 ohm-cm, or glass substrates. For organic materials, the substrate 100 may comprise, for example, polyimide, polycarbonate (PC) or polyethylene terephthalate (PET).

Next, a dielectric layer 102 is formed on the substrate 100. In one embodiment, the dielectric layer 102 may comprise silicon dioxide ($SiO_2$) or polyvinyl phenol (PVP). When the dielectric layer 102 is PVP, the step of forming the PVP dielectric layer 102 further comprises dissolving a polyvinyl phenol (PVP) powder (manufactured, for example, by Aldrich Co; molecular weight (Mw): 20000~23000) with weight of about 0.03 to 0.13 g in a solvent such as propylene glycol methyl ether acetate (PGMEA) to form a PVP solution with PVP concentration of about 3 wt % to about 13 wt % (weight percentage). Alternatively, a cross-linking agent of poly (melamine-co-formaldehyde) (PMF) (manufactured, for example, by Aldrich Co; molecular weight (Mw): 511) with weight of about 0.03 to 0.13 g and a photoacid generator (PAG) with weight of about 0.03 to 0.13 g, which serve as cationic initiators, may be added to the PVP solution to form a low temperature cross-linking PVP prescription solution. Next, the PVP solution or the PVP prescription solution may be formed on the substrate 100 by spin-coating, inkjet-printing, casting, roll-to-roll contact-printing or dip-coating. In one embodiment, the PAG of the PVP prescription solution may have a photochemical reaction with an irradiating ultraviolet (UV) light with a wavelength of about 365 nm to generate acidic materials. Therefore, a cross-linking reaction may be performed speedily in the PVP prescription solution. The PVP prescription solution may be irradiated by the UV light for about 30 seconds to 1 minute, preferably for about 1 minute. Next, the solvent in the PVP solution or the PVP prescription solution may be removed by baking. The solvent in the PVP solution or the PVP prescription solution may be removed by baking for about 10 minutes to 1 hour, preferably for about 30 minutes. The solvent in the PVP solution or the PVP prescription solution may be removed by baking at a temperature of about 90° C. to 200° C., preferably at about 120° C. Therefore, a PVP dielectric layer 102 may be formed on the substrate 100. The process of forming the PVP dielectric layer 102 as described is a low temperature process (<200° C.). The process can prevent transmutation of the substrate 100 comprising polymer materials formed by a high temperature process. In this embodiment, the substrate 100 and the PVP dielectric layer 102 may serve as a gate and a gate dielectric of an organic thin film transistor, respectively.

Figure 1B:
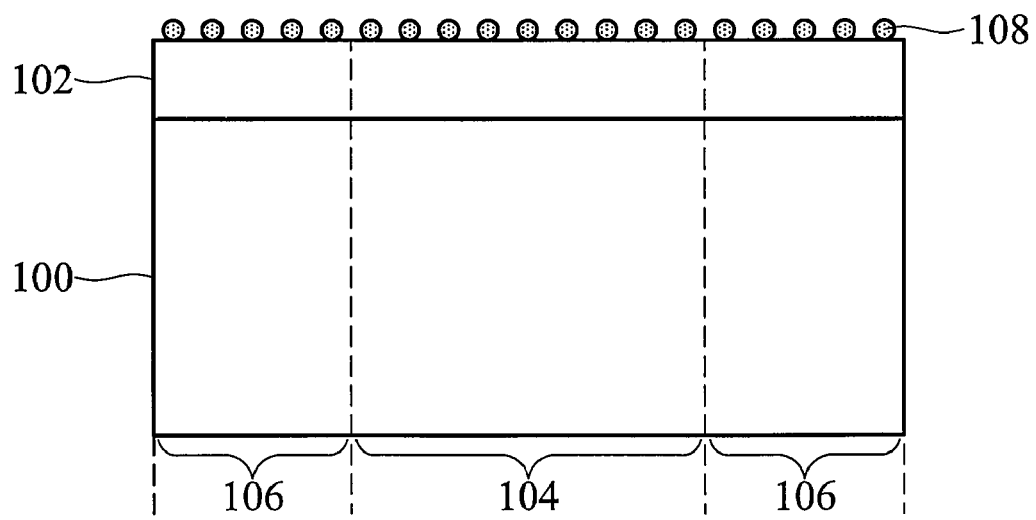

Next, referring to FIG. 1b, a first self-assembled monolayer (SAM) 108 is formed over the entire region. The first self-assembled monolayer (SAM) 108 may be formed by, for example, vacuum deposition, spin-coating, inkjet-printing, casting, roll-to-roll contact-printing or dip-coating. In one embodiment, the first self-assembled monolayer (SAM) 108 may comprise hexamethydisiliazane (HMDS).

Figure 1C:
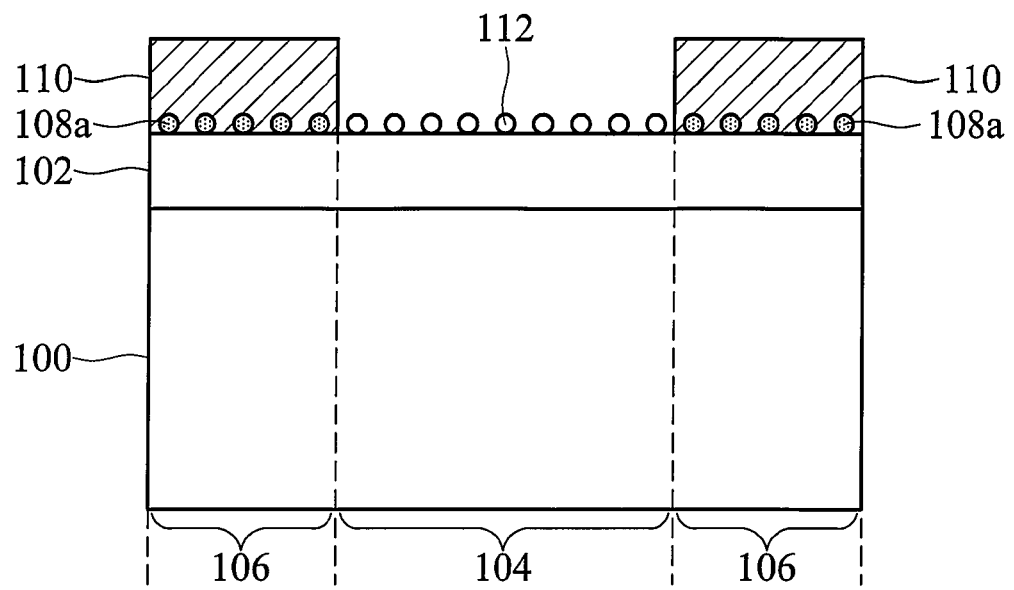

Referring to FIG. 1c, a patterned photoresist layer 110 is then formed on the dielectric layer 102 in the source/drain regions 106, covering a portion of the first self-assembled monolayer (SAM) 108. Next, the first self-assembled monolayer (SAM) 108 not covered by the patterned photoresist layer 110 is removed by such as $O_2$ plasma bombardment. Next, a patterned second self-assembled monolayer (SAM) 112 is formed on the dielectric layer 102 in the channel region 104 by, for example, vacuum deposition, spin-coating, inkjet-printing, casting, roll-to-roll contact-printing or dip-coating. In one embodiment, the second self-assembled monolayer (SAM) 112 may comprise octyl-trichlorosilane (OTS).

Figure 1D:
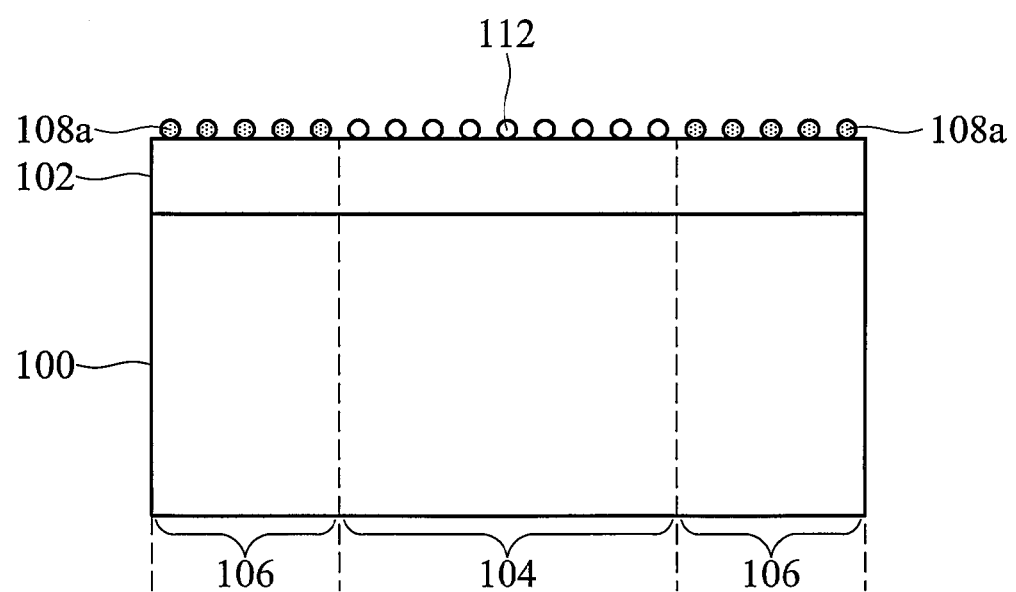

Next, referring to FIG. 1d, the patterned photoresist layer 110 is removed to form a first patterned self-assembled monolayer (SAM) 108a and a patterned second self-assembled monolayer (SAM) 112 on the dielectric layer 102 in the source/drain regions 106 and the dielectric layer 102 in the channel region 104, respectively. The patterned first self-assembled monolayer (SAM) 108a may have a higher affinity then that of the patterned second self-assembled monolayer (SAM) 112. Compared with the patterned first SAM 108a and the patterned second SAM 112, the patterned first SAM 108a may have relative wetting behavior, and the patterned second SAM 112 may have relative dewetting behavior. As shown in Table. 1, in alternative embodiments, the patterned first SAM 108a and the patterned second SAM 112 may have various combinations. For example, in Example 1, the patterned first SAM 108a may comprise HMDS, and the patterned second SAM 112 may comprise OTS. In Example 2, the patterned first SAM 108a may comprise metal, and the patterned second SAM 112 may comprise OTS. In Example 3, the patterned first SAM 108a may comprise HMDS, and the patterned second SAM 112 may comprise metal or OTS.

TABLE 1

Combinations of a patterned first/third self-assembled monolayer and a second/fourth self-assembled monolayer.

| | Patterned first/third self-assembled monolayer | patterned second/fourth self-assembled monolayer |
|---|---|---|
| Example 1 | hexamethydisiliazane (HMDS) | octyl-trichlorosilane (OTS) |
| Example 2 | Metal | octyl-trichlorosilane (OTS) |
| Example 3 | hexamethydisiliazane (HMDS) | metal octyl-trichlorosilane (OTS) |

Figure 1E:
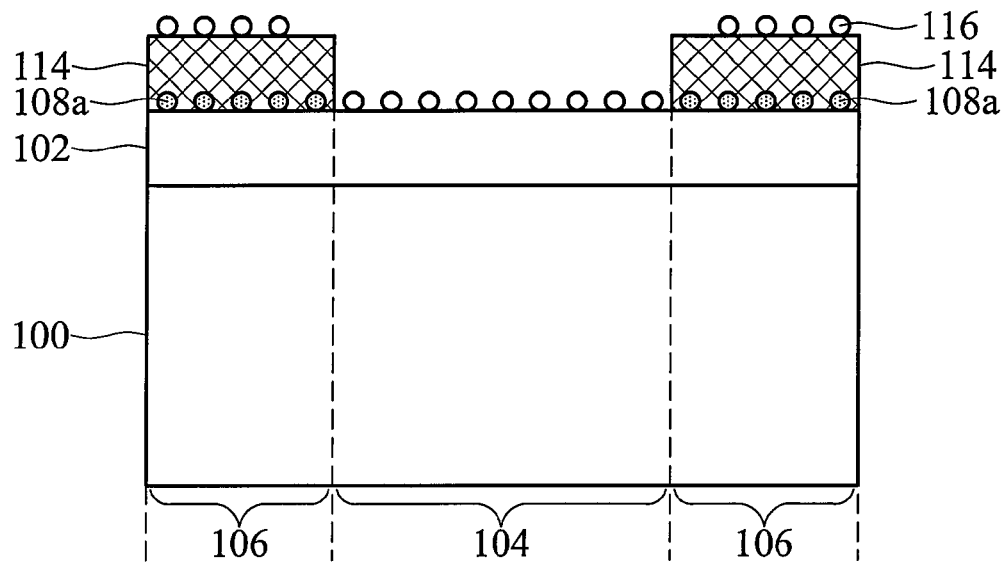

Next, referring to FIG. 1e, a pair of source/drain layers 114 is formed on the dielectric layer 102 in the source/drain regions 106. In one embodiment, the source/drain layers 114 may be conductive layers comprising metals or conductive polymers. When the source/drain layers 114 is a metal layer, the source/drain layers 114 may be formed by entirely forming the metal layer comprising Au, Pt or alloys thereof. Next, a portion of the metal layer may be removed to form a pair of source/drain layers 114 on the dielectric layer 102 in the source/drain regions 106 by photolithography and etching processes. When the source/drain layers 114 is a conductive polymer layer, the step of forming the source/drain layers 114 further comprises dissolving a conductive polymer material in a solvent to form a conductive polymer solution. In one embodiment, the conductive polymer material may comprise poly(3,4-ethylenedioxy-thiophene)/poly (styrenesulfonate) (PEDOT/PSS) or polyaniline/polystyrene sulfonic acid (PANI/PSSA). The solvent may comprise ethers, ketones, esters, isopropylalcohol (IPA), ethanol or water. Next, the conductive polymer solution is formed on the patterned first SAM 108a and the patterned second SAM 112 by, for example, spin-coating, inkjet-printing, casting, roll-to-roll contact-printing or dip-coating. Next, the solvent in the conductive polymer solution may be removed by baking. The solvent in the conductive polymer solution may be removed by baking for about 10 minutes to 1 hour, preferably for about 30 minutes. The solvent in the conductive polymer solution may be removed by baking at a temperature of about 60° C. to 200° C., preferably at about 120° C. Because the patterned first SAM 108a may have a higher affinity then that of the patterned second SAM 112, the conductive polymer source/drain layers 114 may be selectively formed on the patterned first SAM 108a, in the source/drain regions 106.

Next, the second SAM 112 in the channel region 104 may be removed by such as $O_2$ plasma bombardment. Next, a third SAM 116 may be formed over the entire region by, for example, vacuum deposition, spin-coating, inkjet-printing, casting, roll-to-roll contact-printing or dip-coating. In one embodiment, the third SAM 116 may comprise hexamethydisiliazane (HMDS).

Figure 1F:
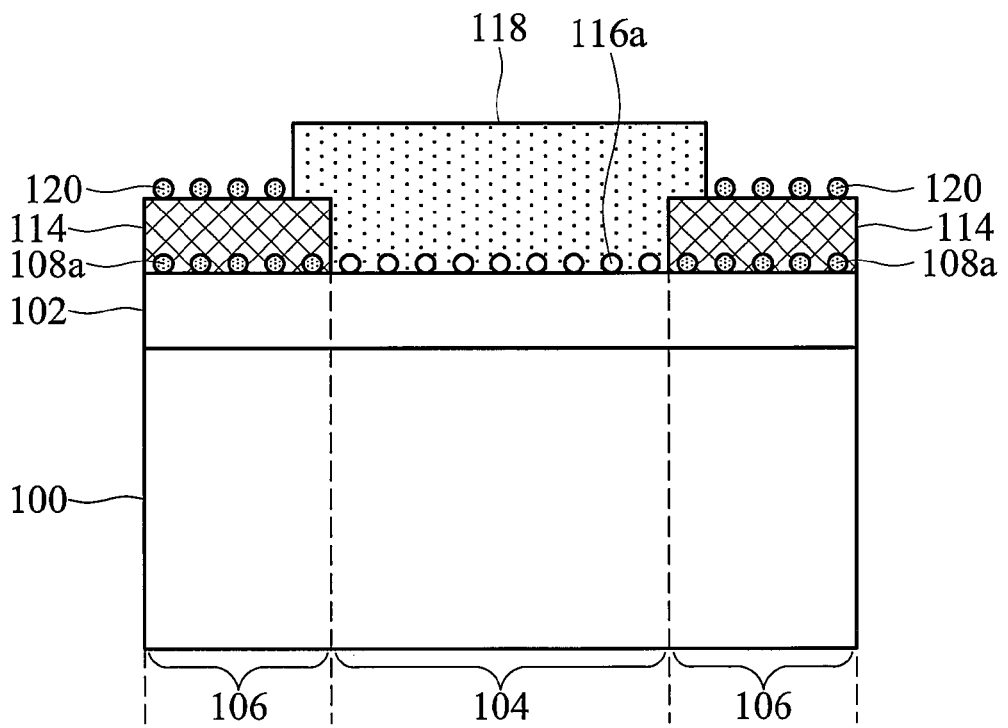

Next, referring to FIG. 1f, a patterned photoresist layer 118 is formed on the dielectric layer 102 in the channel region 104 and a portion of the source/drain layers 116 adjacent to two sides of the channel region 104, covering a portion of the third SAM 116. The third SAM 116 not covered by the patterned photoresist layer 118 is then removed to form a patterned third SAM 116a by such as $O_2$ plasma bombardment. Next, a patterned fourth SAM 120 is formed on the remaining source/drain layers 114 by, for example, vacuum deposition, spin-coating, inkjet-printing, casting, roll-to-roll contact-printing or dip-coating. In one embodiment, the patterned fourth SAM 120 may comprise octyl-trichlorosilane (OTS).

Figure 1G:
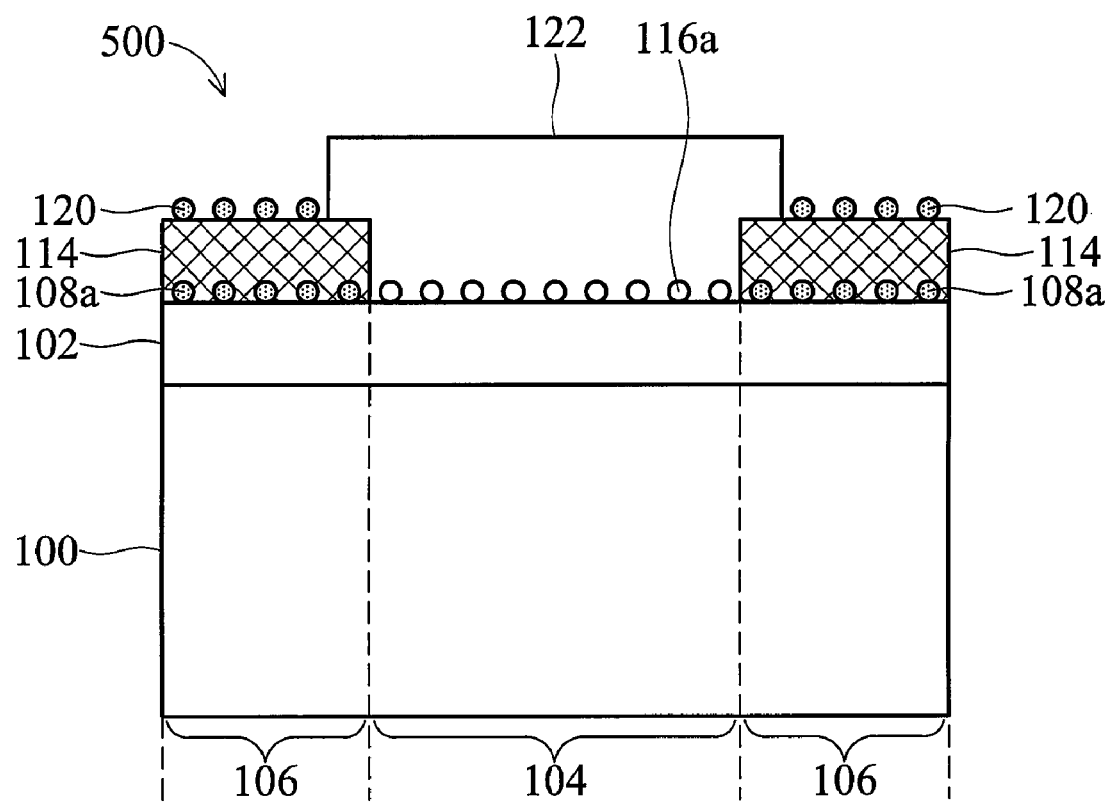

Referring to FIG. 1g, the patterned photoresist layer 118 is then removed to form a patterned third SAM 116a on the dielectric layer 102 in the channel region 104 and a portion of the source/drain layers 114 adjacent to two sides of the channel region 104, and then removed to form a patterned fourth SAM 120 on the remaining source/drain layers 114 in the source/drain region 106. The patterned third SAM 116a may have a higher affinity then that of the patterned fourth SAM 120. Compared with the patterned third SAM 116a and the patterned fourth SAM 120, the patterned third SAM 116a may have relative wetting behavior, and the patterned fourth SAM 120 may have relative dewetting behavior. Also, in alternative embodiments, the patterned third SAM 116a and the patterned fourth SAM 120 may have various combinations as shown in Table. 1.

Next, a semiconductor layer 122 is selectively formed on the patterned third SAM 116a. In one embodiment, the semiconductor layer 122 may comprise poly(3-hexylthiophene) (P3HT), pentacene precursor, carbon nanotube, zinc oxide, dihexylsexithiophene (DH-6T), poly(benzimidazobenzophenanthroline) (BBL) or C60 derivatives. The step of forming the semiconductor layer 122 comprising poly(3-hexylthiophene) (P3HT) or pentacene precursor further comprises dissolving or suspending a semiconductor material in a solvent to form a semiconductor solution with semiconductor material concentration of about 0.1 wt % to about 0.5 wt % (weight percentage). The solvent may comprise toluene, xylene, dichloromethane, trichloromethane (Chloroform), tetrahydrofuran or dichlorobenzene or water. The semiconductor solution is then formed on the patterned third SAM 116a and the patterned fourth SAM 120 by, for example, spin-coating, inkjet-printing, casting, roll-to-roll contact-printing or dip-coating. Next, the solvent in the semiconductor solution may be removed by baking. The solvent in the conductive polymer solution may be removed by baking for about 10 minutes to 1 hour, preferably for about 30 minutes. The solvent in the semiconductor solution may be removed by baking at a temperature of about 60° C. to 200° C., preferably at about 120° C. Because of the patterned third SAM 116a may have a higher affinity then that of the patterned fourth SAM 120, the semiconductor layer 122 may be selectively formed on the third SAM 116a. In one embodiment, the semiconductor layer 122 may serve as an active layer of an organic thin film transistor. Thus, fabrication of an electronic device 500 according to one embodiment of the invention is complete.

In the one embodiment of the electronic device 500 of the invention, two adjacent patterned SAMs with different affinities are formed in different regions on a substrate. For example, a patterned first SAM with a higher affinity and an adjacent patterned second SAM with a lower affinity are formed with relative wetting and relative dewetting patterned regions on a substrate, respectively. Next, a semiconductor, dielectric or conductive material is dissolved or suspended in a solvent to form a solution. The solution is then coated on the substrate by, for example, spin-coating, inkjet-printing, casting, roll-to-roll contact-printing or dip-coating. Next, the solvent in the solution may be removed by baking to selectively form a patterned layer on the patterned first SAM with a higher affinity. Compared with the conventional patterning processes, one embodiment of the electronic device of the invention may attract or repulse the subsequent coated solution using relative wetting or relative dewetting behavior of patterned SAMs. Therefore, a patterned layer may be selectively formed on the relative wetting patterned SAM without destroying the layer by the conventional etching process. Additionally, the patterning process of the layer using the patterned SAMs may fabricate larger sized electronic devices more quickly and precisely. Also, the patterning process of the layer using the patterned SAMs may have advantages of cost savings and improved throughput.

Figure 2A:
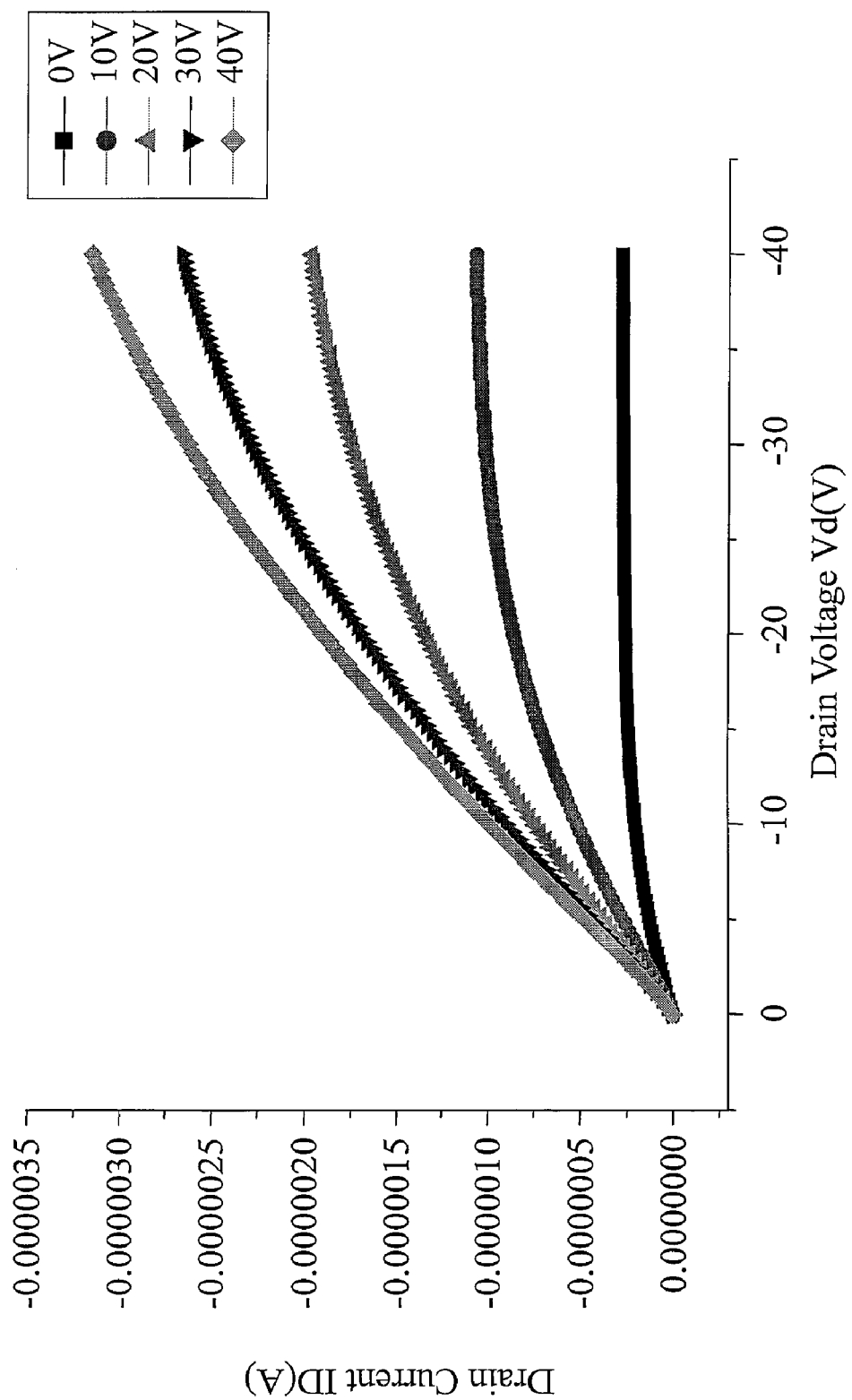
FIGS. 2a and 2b are drain-current (Id) versus drain-voltage (Vd) comparisons of an embodiment of a fabricated organic thin film transistor of the invention and a conventional organic thin film transistor.
Figure 2B:
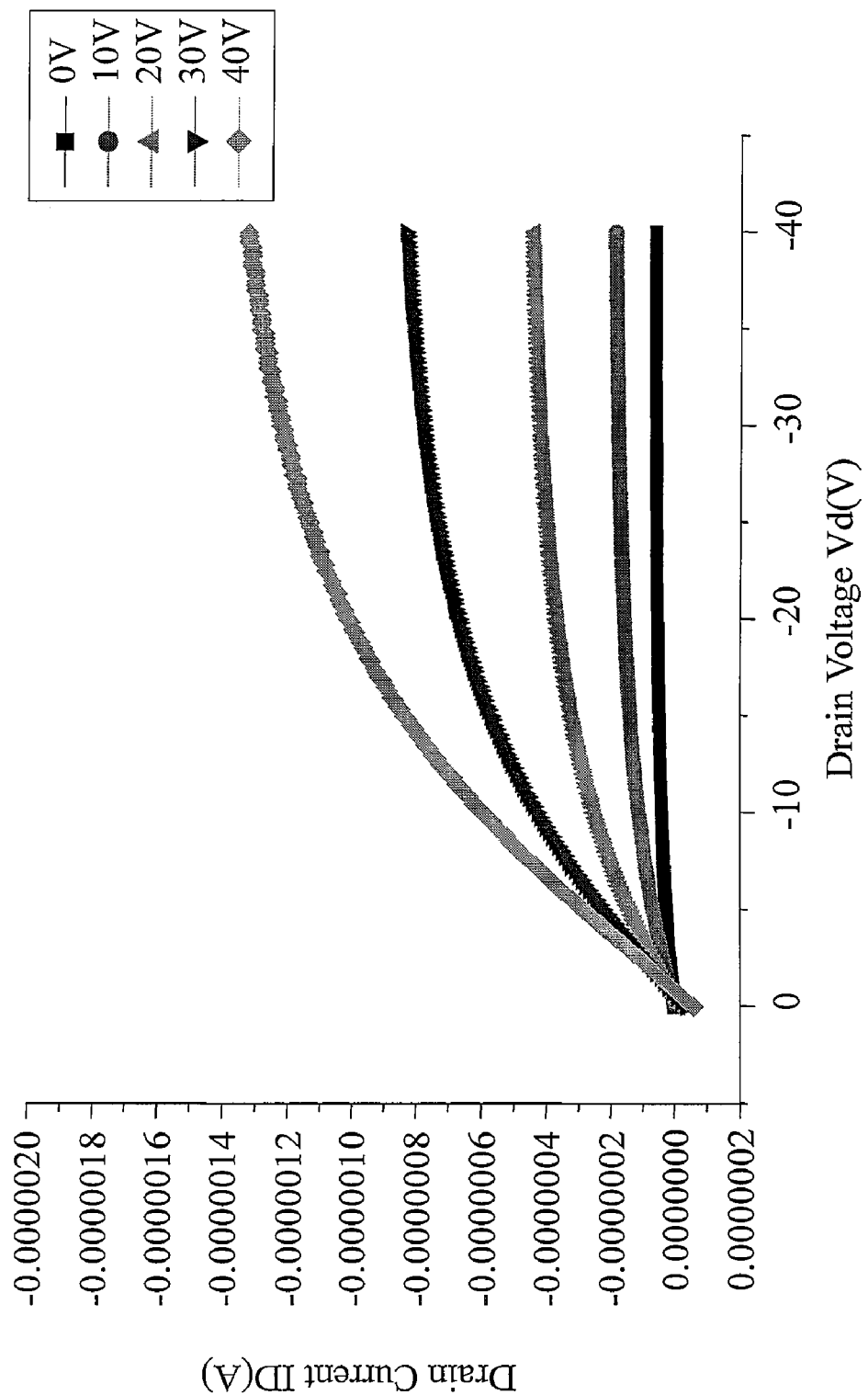

FIGS. 2a, 2b, 3a, 3b and Table. 2 are device electrical performance comparisons of an embodiment of a fabricated organic thin film transistor 500 of the invention and a conventional organic thin film transistor. FIGS. 2a and 2b are drain-current (Id) versus drain-voltage (Vd) comparisons of an embodiment of a fabricated organic thin film transistor 500 of the invention and a conventional organic thin film transistor. The organic thin film transistor 500 shows about 3.2 µA drain current at −40V drain voltage and −40V gate voltage. The conventional organic thin film transistor shows about 1.3 µA drain current at −40V drain voltage and −40V gate voltage. Referring to FIGS. 2a and 2b, it was shown that the organic thin film transistor 500 had higher drain current at the same drain voltage and gate voltage when compared with the conventional organic thin film transistor.

Figure 3A:
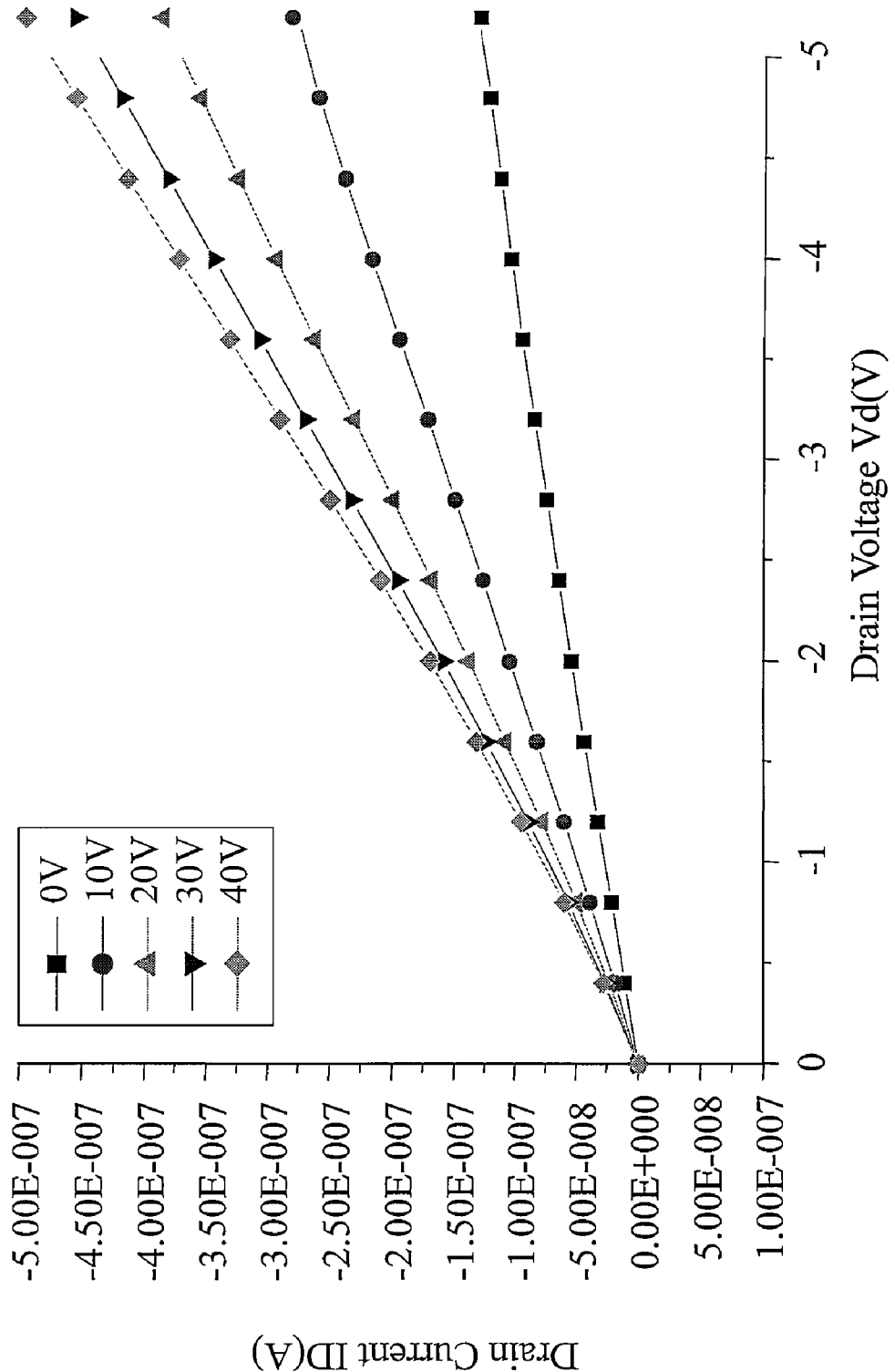
FIGS. 3a and 3b are drain-current (Id) versus drain-voltage (Vd) comparisons for an embodiment of a fabricated organic thin film transistor of the invention and a conventional organic thin film transistor.
Figure 3B:
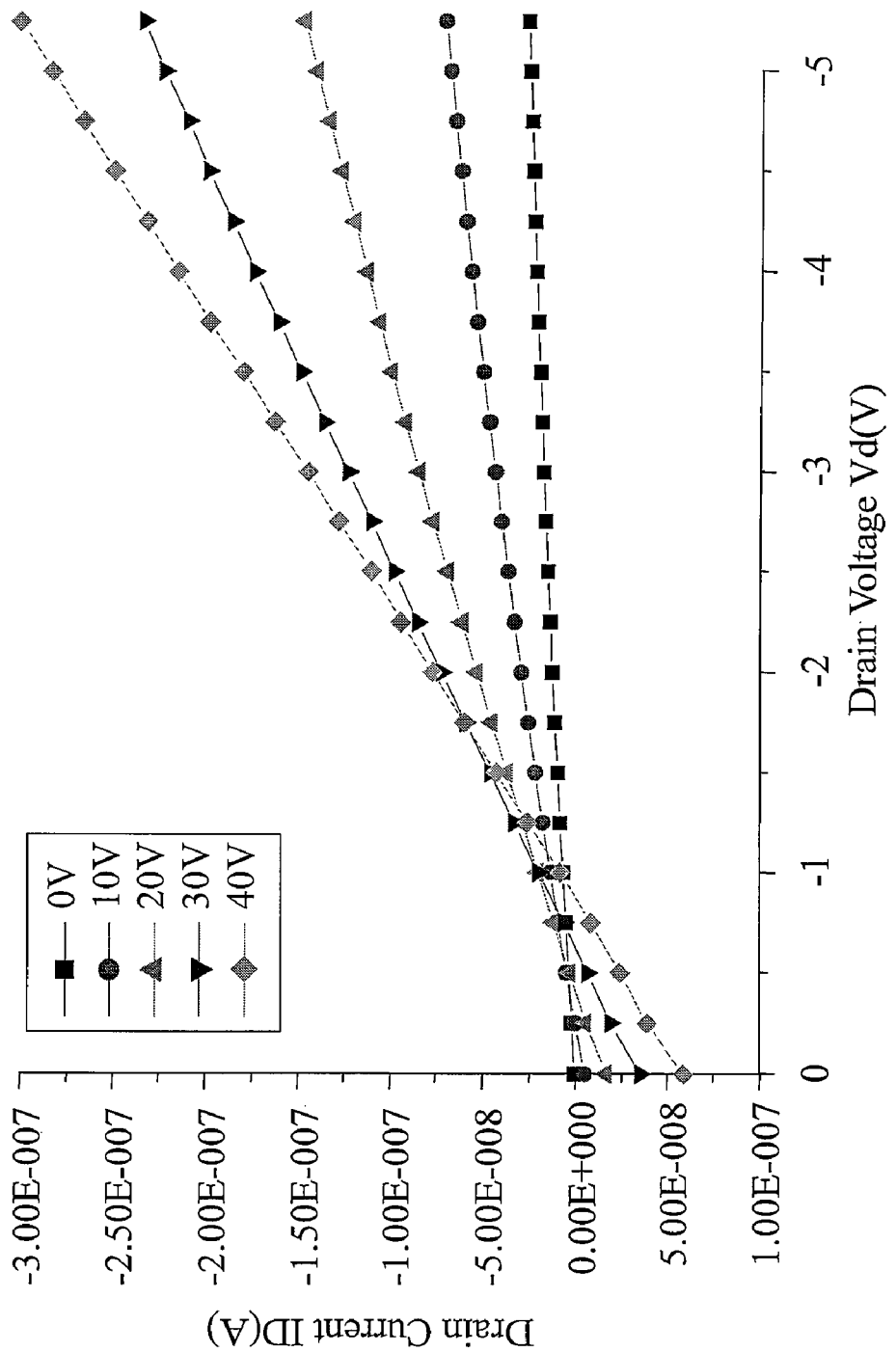

FIGS. 3a and 3b are drain-current (Id) versus drain-voltage (Vd) comparisons of an embodiment of a fabricated organic thin film transistor 500 of the invention and a conventional organic thin film transistor. When the drain voltage is close to 0V, the drain current of the organic thin film transistor 500 is close to 0 A. Unlike the conventional organic thin film transistor, wherein when the drain voltage is close to 0V, the drain current of the conventional organic thin film transistor contains a leakage current. Referring to FIGS. 3a and 3b, it was shown that the organic thin film transistor 500 had lower leakage current when the drain voltage neared 0V when compared with the conventional organic thin film transistor.

Table 2 shows electrical performance comparisons of an embodiment for a fabricated organic thin film transistor 500 of the invention and a conventional organic thin film transistor. Referring to Table 2, it was shown that the organic thin film transistor 500 had advantages of lower leakage current and faster device operation when compared with the conventional organic thin film transistor.

TABLE 2

Electrical performance comparisons of an embodiment for a fabricated organic thin film transistor 500 of the invention and a conventional organic thin film transistor.

| | carrier mobility (µ) ($cm^2/Vs$) | On/Off current ratio (Ion/Ioff) | subthreshold slope (V/dec) | threshold voltage (Vt) (V) |
|---|---|---|---|---|
| organic thin film transistor 500 | $1.0 \times 10^{-3}$ | $3.7 \times 10^6$ | 1.22 | 26.7 |
| conventional organic thin film transistor | $3.8 \times 10^{-4}$ | $2.1 \times 10^3$ | 3.84 | 11.9 |

A method for fabricating an electronic device is provided. The method for fabricating the electrical device uses two adjacent patterned SAMs with different affinities to pattern a layer. The described patterning process of the layer using the patterned SAMs may quickly and precisely fabricate electronic devices with large sizes. Also, the described patterning process of the organic layer using the patterned SAMs may have advantages of cost saving and improved throughput. Moreover, an organic thin film transistor using the described patterning process of the invention may have advantages of higher drain current, lower leakage current and faster device operation. Therefore, the described patterning process of the invention may have higher application value for development of electronic devices.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an electronic device, comprising:
   providing a substrate;
   entirely forming a first self-assembled monolayer on the substrate;
   forming a patterned photoresist layer on a portion of the first self-assembled monolayer;
   removing the first self-assembled monolayer not covered by the patterned photoresist layer until a portion of the substrate is exposed;
   forming a patterned second self-assembled monolayer on the exposed substrate;
   removing the patterned photoresist layer to form a patterned first self-assembled monolayer and an adjacent patterned second self-assembled monolayer on the substrate, wherein the patterned first self-assembled monolayer has a higher affinity then that of the patterned second self-assembled monolayer;
   coating a solution on the substrate, wherein the solution is formed by dissolving or suspending a conductive, semiconductor or insulating material in a solvent;
   removing the solvent in the solution to selectively form a patterned conductive, semiconductor or insulating layer on the patterned first self-assembled monolayer.

2. The method for fabricating an electronic device as claimed in claim 1, wherein the first self-assembled monolayer comprises hexamethydisiliazane (HMDS).

3. The method for fabricating an electronic device as claimed in claim 1, wherein the second self-assembled monolayer comprises octyl-trichlorosilane (OTS).

4. The method for fabricating an electronic device as claimed in claim 1, wherein the conductive, semiconductor or insulating material comprises polyvinyl phenol (PVP), poly (3-hexylthiophene) (P3HT), pentacene precursor, dihexylsexithiophene (DH-6T), poly(benzimidazobenzophenanthroline) (BBL), carbon nanotube, C60 derivatives, poly(3,4-ethylenedioxy-thiophene)/poly (styrenesulfonate) (PEDOT/PSS) or polyaniline/polystyrene sulfonic acid (PANI/PSSA).

5. The method for fabricating an electronic device as claimed in claim 1, wherein the solvent comprises propylene glycol methyl ether acetate (PGMEA), toluene, xylene, dichloromethane, trichloromethane (Chloroform), tetrahydrofuran, dichlorobenzene, water, ethers, ketones, esters, isopropylalcohol (IPA) or ethanol.

6. A method for fabricating an electronic device, comprising:
   providing a substrate having a channel region and a pair of source/drain regions, wherein the pair of the source/drain regions is adjacent to two sides of the channel region, respectively;
   forming a dielectric layer on the substrate;
   forming a pair of source/drain layers on the dielectric layer in the source/drain regions;
   forming a first self-assembled monolayer over the entire region;
   forming a patterned photoresist layer on the dielectric layer in the channel region and a portion of the source/drain layers adjacent to two sides of the channel region, covering a portion of the first self-assembled monolayer;
   removing the first self-assembled monolayer not covered by the patterned photoresist layer;
   forming a patterned second self-assembled monolayer on the remaining source/drain layers;
   removing the patterned photoresist layer to form a patterned first self-assembled monolayer on the dielectric layer in the channel region and a portion of the source/drain layers adjacent to two sides of the channel region and a patterned second self-assembled monolayer on the remaining source/drain layers, wherein the patterned first self-assembled monolayer has a higher affinity then that of the patterned second self-assembled monolayer; and
   selectively forming a semiconductor layer on the patterned first self-assembled monolayer.

7. The method for fabricating an electronic device as claimed in claim 6, wherein the dielectric layer comprises silicon dioxide or polyvinyl phenol (PVP).

8. The method for fabricating an electronic device as claimed in claim 6, wherein the semiconductor layer is formed comprising:
   dissolving or suspending a semiconductor material in a solvent to form an semiconductor solution;
   forming the semiconductor solution on the patterned first self-assembled monolayer and the patterned second self-assembled monolayer; and
   removing the solvent in the solution to selectively form a semiconductor layer on the patterned first self-assembled monolayer.

9. The method for fabricating an electronic device as claimed in claim 6, wherein the semiconductor layer comprises poly(3-hexylthiophene) (P3HT), pentacene precursor, carbon nanotube, dihexylsexithiophene (DH-6T), poly(benzimidazobenzophenanthroline) (BBL), C60 derivatives or zinc oxide.

10. The method for fabricating an electronic device as claimed in claim 6, further comprising:
    respectively forming a patterned third self-assembled monolayer and a patterned fourth self-assembled monolayer on the source/drain regions and the channel region, wherein the patterned third self-assembled monolayer has a higher affinity then that of the patterned fourth self-assembled monolayer; and
    selectively forming a conductive layer on the patterned third self-assembled monolayer before forming a pair of the source/drain layers.

11. The method for fabricating an electronic device as claimed in claim 10, wherein the conductive layer comprises a metal layer or a conductive polymer layer.

12. The method for fabricating an electronic device as claimed in claim 11, wherein the conductive polymer layer is formed comprising:
    dissolving or suspending a conductive polymer material in a solvent to form a conductive polymer solution;
    forming the conductive polymer solution on the patterned third self-assembled monolayer and the patterned fourth self-assembled monolayer; and
    removing the solvent in the conductive polymer solution to selectively form a conductive polymer layer on the patterned third self-assembled monolayer.

13. The method for fabricating an electronic device as claimed in claim 11, wherein the conductive polymer layer comprises poly(3,4-ethylenedioxy-thiophene)/poly (styrenesulfonate) (PEDOT/PSS) or polyaniline/polystyrene sulfonic acid (PANI/PSSA).

14. The method for fabricating an electronic device as claimed in claim 10, further comprising:
- forming a third self-assembled monolayer over the entire region;
- forming a patterned photoresist layer on the source/drain regions, covering a portion of the third self-assembled monolayer;
- removing the third self-assembled monolayer not covered by the patterned photoresist layer;
- forming a patterned fourth self-assembled monolayer on the dielectric layer in the channel region; and
- removing the patterned photoresist layer before forming the patterned third and fourth self-assembled monolayers.

15. The method for fabricating an electronic device as claimed in claim 10, wherein the patterned third self-assembled monolayer comprises hexamethydisiliazane (HMDS).

16. The method for fabricating an electronic device as claimed in claim 10, wherein the fourth self-assembled monolayer comprises octyl-trichlorosilane (OTS).

17. The method for fabricating an electronic device as claimed in claim 6, wherein the patterned first self-assembled monolayer comprises hexamethydisiliazane (HMDS).

18. The method for fabricating an electronic device as claimed in claim 6, wherein the second self-assembled monolayer comprises octyl-trichlorosilane (OTS).

* * * * *